US007782045B2

(12) United States Patent
Wang et al.

(10) Patent No.: US 7,782,045 B2

(45) Date of Patent: Aug. 24, 2010

(54) MULTI-SIGNAL INPUT TESTING APPARATUS

(75) Inventors: Chuan-Bang Wang, Shenzhen (CN); Yan-Kai Zhang, Shenzhen (CN); Yu-Ping Wu, Shenzhen (CN); Jun She, Shenzhen (CN)

(73) Assignees: Innocom Technology (Shenzhen) Co., Ltd., Shenzhen, Guangdong Province (CN); Chimel Innolux Corporation, Miao-Li County (TW)

( * ) Notice: Subject to any disclaimer, the term of this patent is extended or adjusted under 35 U.S.C. 154(b) by 1093 days.

(21) Appl. No.: 11/455,914

(22) Filed: Jun. 19, 2006

(65) Prior Publication Data

US 2006/0284641 A1 Dec. 21, 2006

(30) Foreign Application Priority Data

Jun. 17, 2005 (TW) .............................. 94210203 U

(51) Int. Cl.
*G01R 31/28* (2006.01)
*G01R 31/00* (2006.01)
*G01R 31/02* (2006.01)

(52) U.S. Cl. ..................... 324/158.1; 324/770; 324/755

(58) Field of Classification Search ................. 324/770, 324/158, 755
See application file for complete search history.

(56) References Cited

U.S. PATENT DOCUMENTS 5,856,819 A * 1/1999 Vossler ........................ 345/102
6,809,544 B2 * 10/2004 Liao et al. .................. 324/770

* cited by examiner

*Primary Examiner*—William K Cheung
(74) *Attorney, Agent, or Firm*—Wei Te Chung

(57) ABSTRACT

An exemplary multi-signal input testing apparatus (2) includes a testing table (20), a transfer table (21) slidably positioned on the testing table, and a pair of multi-signal input devices (25) arranged on the transfer table. Each multi-signal input device includes a pair of connect ends (251, 252). One of the connect ends includes a plurality of pinhole terminals for receiving various testing signals, and the other connect end includes a plurality of connectors for supplying the testing signals to a product to be tested. This means that several tests can be automatically performed by a same multi-signal input testing apparatus at any single testing station. This speeds the testing of the products, and helps promote the efficiency of the testing process. In addition, it can simplify the configuration of various testing equipment and save space. Furthermore, there is little or no need for manual work by operators.

10 Claims, 4 Drawing Sheets

MULTI-SIGNAL INPUT TESTING APPARATUS

CROSS-REFERENCE TO RELATED APPLICATION

This application is related to, and claims the benefit of, a foreign priority application filed in Taiwan as Serial No. 094210203 on Jun. 17, 2005. The related application is incorporated herein by reference.

FIELD OF THE INVENTION

The present invention relates to multi-signal input testing apparatus, and more particularly to a multi-signal input testing apparatus for promoting the efficiency of testing of products such as liquid crystal displays (LCDs) in manufacturing.

BACKGROUND

In a typical process of manufacturing products such as LCD modules, testing and controlling the quality of each LCD module is important. Characteristics that relate to the quality of images shown by an LCD display of the LCD module are tested. Such characteristics include for example voltage and current level loadings, the absence of short circuits, and the brightness and uniformity of the LCD display.

FIG. 4 is a schematic, isometric view of part of a typical testing device used in an LCD testing line, together with an LCD positioned on the testing device. The testing device 1 includes a testing table 10, and a transfer table 11 slidably arranged on the testing table 10. The LCD 100 to be tested is positioned on the transfer table 11, and is transferred to testing equipment at each of testing stations by sliding of the transfer table 11 along the testing table 10. A voltage connector 12 is provided on the transfer table 11. The voltage connector 12 is used to receive external voltages.

The ongoing demand for better image display quality of LCDs 100 means that the number of tests that need to be performed is increasing, and the types of tests performed are becoming more complex and comprehensive. Various testing stations employ different testing circuits, which require the use of various lead wires to connect with the LCDs 100. The testing table 10 of the testing device 1 is liable to become cluttered with different lead wires and other equipment at various stages in the testing process.

What is needed, therefore, is a testing device that overcomes the above-described deficiencies.

SUMMARY

A multi-signal input testing apparatus includes a testing table, a transfer table positioned on the testing table, and at least one multi-signal input device arranged in the transfer table. Each multi-signal input device includes a plurality of connect ends to enable a variety of tests to be conveniently performed on a product to be tested.

One of the connect ends includes a plurality of pinhole terminals for receiving various testing signals, and the other connect end includes a plurality of connectors for supplying the testing signals to the product to be tested. This means that several tests can be automatically performed by a same multi-signal input testing apparatus at any single testing station. This speeds the testing of the products, and helps promote the efficiency of the testing process. In addition, it can simplify the configuration of various testing equipment and save space. Furthermore, there is little or no need for manual work by operators.

Other advantages and novel features of preferred embodiments will become more apparent from the following detailed description when taken in conjunction with the accompanying drawings.

DETAILED DESCRIPTION OF PREFERRED EMBODIMENTS

Figure 1:
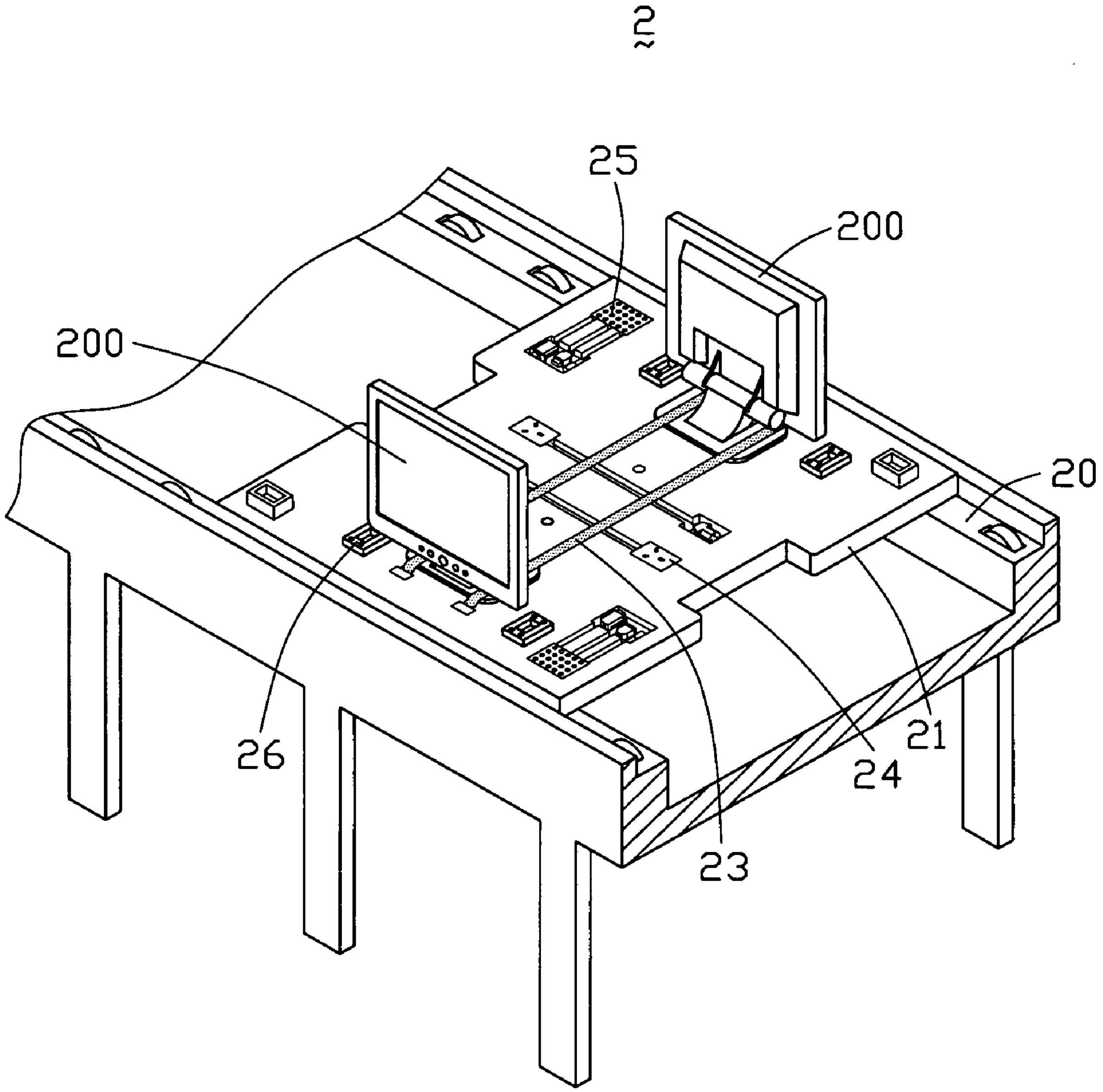
FIG. 1 is a schematic, isometric view of part of a multi-signal input testing apparatus according to an exemplary embodiment of the present invention, together with two LCDs positioned on the multi-signal input testing apparatus.

As shown in FIG. 1, a multi-signal input testing apparatus 2 according to an exemplary embodiment of the present invention includes a testing table 20, and a transfer table 21 slidably arranged on the testing table 20. Two LCDs 200 to be tested are positioned on the transfer table 21, and are transferred to various testing equipment at one or more testing stations by sliding of the transfer table 21 along the testing table 20. The testing equipment at each testing station typically includes one or more testing devices. Two flexible strips 23 are arranged on the transfer table 21, for facilitating removable fixing of the LCDs 200 to the transfer table 21.

Figure 2:
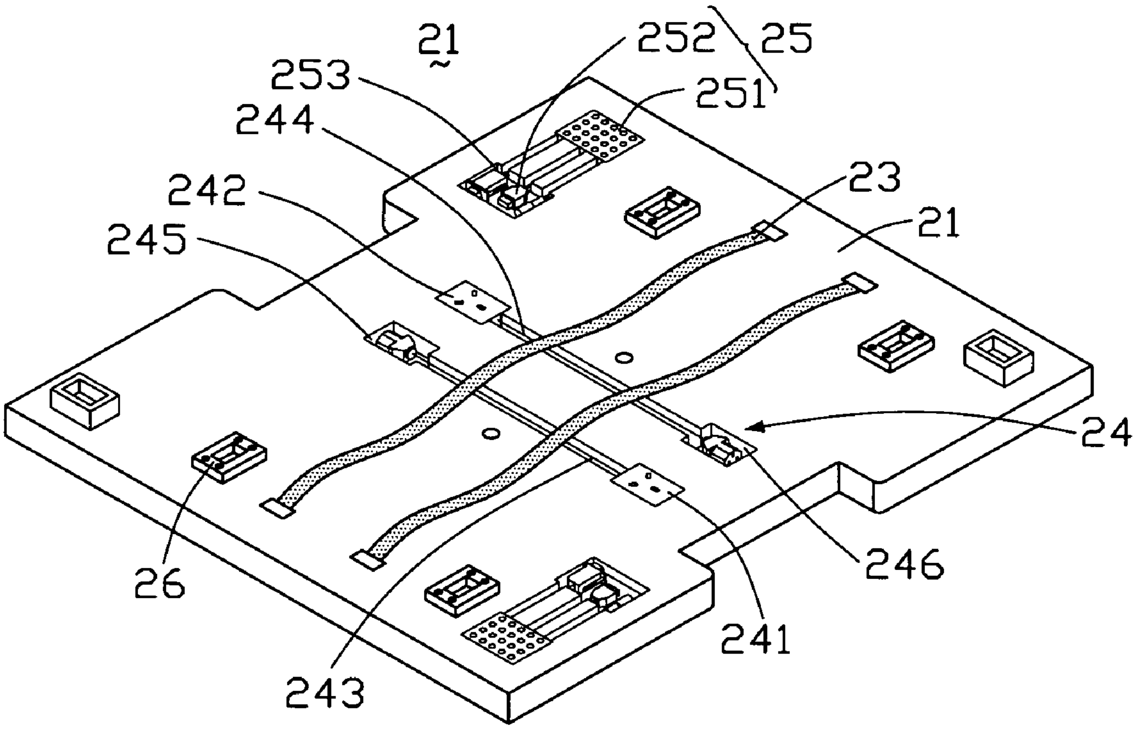
FIG. 2 is an isometric view of a transfer table of the multi-signal input testing apparatus of FIG. 1.

Also referring to FIG. 2, the transfer table 21 further includes two current inputs 24, two multi-signal input devices 25, and four positioning collars 26. The current inputs 24 include two power jacks 241, 242 connecting with two power lines 243, 244 respectively. The power lines 243, 244 are respectively disposed within two parallel grooves 245, 246 which are defined in the transfer table 21. The power jacks 241, 242 are located at ends of the grooves 245, 246 respectively, such that the power jacks 241, 242 are generally diagonally opposite from each other. With this arrangement, there are no power lines cluttering a top of the transfer table 21.

Each multi-signal input device 25 includes a first connect end 251 and a second connect end 252. The first connect end 251 includes a plurality of pinhole terminals which can receive external signals from corresponding pins of a testing device (not shown). Such signals can include a serial communication signal, a video signal, and an audio signal. The second connect end 252 typically includes a serial communication signal connector, a video signal connector, and an audio signal connector. The pinhole terminals that receive the serial communication signal, video signal, and audio signal are electrically connected to the serial communication signal connector, the video signal connector, and the audio signal connector respectively.

Each multi-signal input device 25 further includes a containing slot 253. The containing slot 253 is used to contain the serial communication signal connector, the video signal connector and the audio signal connector of the second connect end 252. With this arrangement, there are no serial communication signal, video signal, or audio signal connectors cluttering a top of the transfer table 21.

Figure 3:
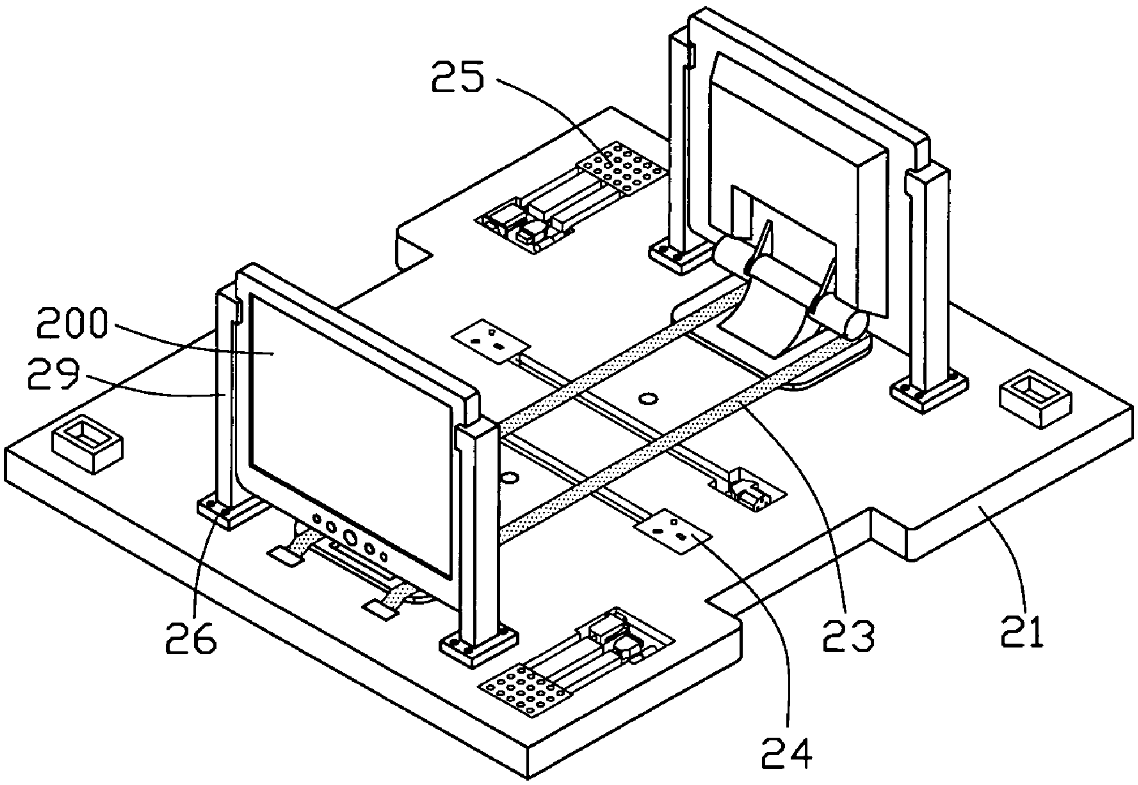
FIG. 3 is similar to FIG. 2, but showing the LCDs of FIG. 1 fixed on the transfer table with positioning clamps.
Figure 4:
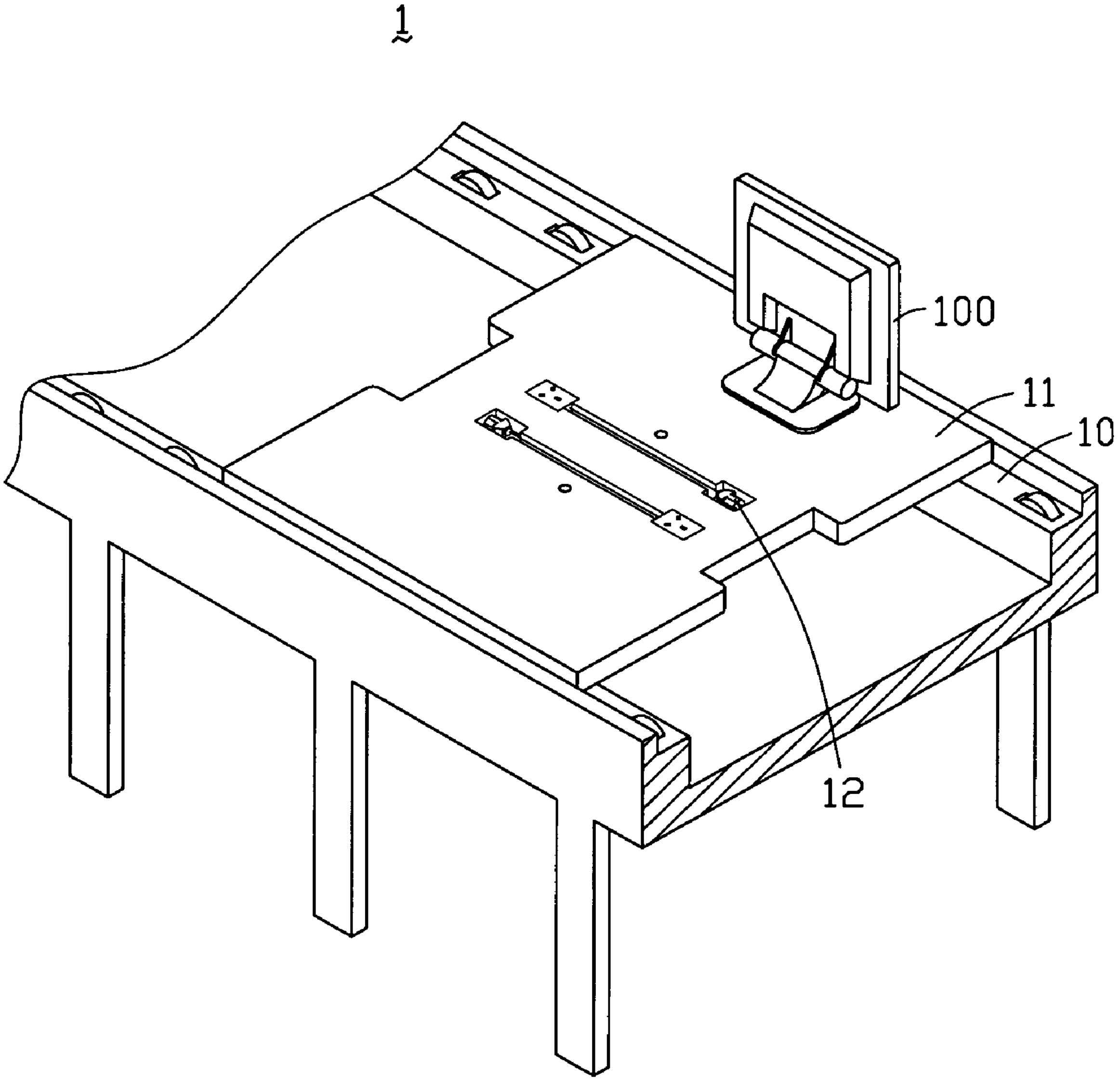
FIG. 4 (RELATED ART)
FIG. 4 is a schematic, isometric view of part of a conventional testing device, together with an LCD positioned on the testing device.

Referring also to FIG. 3, in use, the LCDs 200 are removably fixed on the transfer table 21 by two pairs of positioning clamps 29 respectively, and by the flexible strips 23. Bottom ends of the positioning clamps 29 are inserted into and engaged in the positioning collars 26 respectively. The LCDs 200 are thus firmly held in position during movement of the transfer table 21 from one testing station to a next testing station and during the process of testing at each testing station. Further, each LCD 200 is connected with the serial communication signal connector, video signal connector, and audio signal connector of the corresponding multi-signal input device 25, typically by a plurality of leads (not shown). Thus at each testing station, there is no need for individual manual correction of the positions of the LCDs 200 by an operator, and there is no need for an operator to manually disconnect or connect leads in order for the testing at the testing station to be carried out. Thus when the LCDs 200 arrive at each testing station, they are already set in the correct positions and properly connected ready for testing.

When the LCDs 200 arrive at each testing station, the testing equipment at the testing station turns on a power supply to each LCD 200, and supplies testing signals to the LCD 200 via the corresponding multi-signal input device 25. The first connect end 251 of the multi-signal input device 25 receives the testing signals, and the testing signals transmit to the second connect end 252 and to the LCD 200 via the corresponding lead(s) (not shown).

In summary, each multi-signal input device 25 includes a plurality of pinhole terminals and a plurality of connectors, for receiving various testing signals and supplying the testing signals to the LCD 200 to be tested. This means that several tests can be automatically performed by a same multi-signal input testing apparatus at any single testing station. This speeds the testing of the LCDs 200, and helps promote the efficiency of the testing process. In addition, it can simplify the configuration of various testing equipment and save space. Furthermore, there is little or no need for manual work by operators.

It is to be understood, however, that even though numerous characteristics and advantages of various embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A multi-signal input testing apparatus, comprising:

a testing table; and a transfer table slidably positioned on the testing table, the transfer table configured to support at least one product to be tested, and comprising at least one multi-signal input device, the at least one multi-signal input device comprising a plurality of connect ends capable of receiving testing signals and supply the testing signals to the at least one product; and at least one flexible strip arranged on the transfer table to fix the at least one product to be tested.

2. The multi-signal input testing apparatus as claimed in claim 1, wherein the plurality of connect ends are a first connect end and a second connect end.

3. The multi-signal input testing apparatus as claimed in claim 2, wherein the first connect end comprises a plurality of pinhole terminals for receiving the testing signals.

4. The multi-signal input testing apparatus as claimed in claim 2, wherein the second connect end is connected to the at least one product, whereby the testing signals can transmit to the at least one product.

5. The multi-signal input testing apparatus as claimed in claim 2, wherein the second connect end comprises a serial communication signal connector.

6. The multi-signal input testing apparatus as claimed in claim 2, wherein the second connect end comprises a video signal connector.

7. The multi-signal input testing apparatus as claimed in claim 2, wherein the second connect end comprises an audio signal connector.

8. The multi-signal input testing apparatus as claimed in claim 2, wherein the at least one multi-signal input device further comprises a containing slot containing the second connect end.

9. The multi-signal input testing apparatus as claimed in claim 1, wherein the transfer table further comprises at least one current input.

10. A multi-signal input testing apparatus, comprising:

a testing table; and a transfer table slidably positioned on the testing table, the transfer table configured to support at least one product to be tested, and comprising:

at least one multi-signal input device, the at least one multi-signal input device comprising a plurality of connect ends capable of receiving testing signals and supply the testing signals to the at least one product; and at least two positioning collars and two positioning clamps, wherein the at least two positioning clamps are inserted into the at least two positioning collars to fix the at least one product to be tested.

* * * * *